(12) United States Patent
Abbott, Jr. et al.

(10) Patent No.: US 9,352,532 B2
(45) Date of Patent: May 31, 2016

(54) FILM STACK INCLUDING ADHESIVE LAYER

(71) Applicant: HEWLETT-PACKARD DEVELOPMENT COMPANY, LP, Fort Collins, CO (US)

(72) Inventors: James Elmer Abbott, Jr., Corvallis, OR (US); Peter Mardilovich, Corvallis, OR (US); Randy Hoffman, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 553 days.

(21) Appl. No.: 13/873,580

(22) Filed: Apr. 30, 2013

(65) Prior Publication Data

US 2014/0319972 A1      Oct. 30, 2014

(51) Int. Cl.
| | |
|---|---|
| *H01L 41/09* | (2006.01) |
| *H01L 41/047* | (2006.01) |
| *B32B 7/12* | (2006.01) |
| *H01L 41/08* | (2006.01) |

(52) U.S. Cl.
CPC .............. *B32B 7/12* (2013.01); *H01L 41/0815* (2013.01); *H01L 41/0973* (2013.01); *Y10T 156/10* (2015.01); *Y10T 428/26* (2015.01)

(58) Field of Classification Search
CPC .............. B32B 3/28; B32B 5/02; D04H 1/70; E04C 2/34; G11B 11/10586; G11B 5/7352; G11B 5/66; B82Y 25/00
USPC .................. 310/311–316.01, 316.02, 316.03, 310/317–370
See application file for complete search history.

(56) References Cited

U.S. PATENT DOCUMENTS

| | | | | |
|---|---|---|---|---|
| 6,040,056 | A  * | 3/2000 | Anzaki et al. ................. | 428/432 |
| 8,310,047 | B2 | 11/2012 | Nakano et al. | |
| 9,190,598 | B2 * | 11/2015 | Abbott, Jr. .......... | H01L 41/0815 |
| 2005/0016578 | A1 | 1/2005 | Enomoto et al. | |
| 2005/0248238 | A1 * | 11/2005 | Yamada et al. ............... | 310/366 |
| 2005/0280352 | A1 * | 12/2005 | Lai ................................ | 313/498 |
| 2006/0055745 | A1 * | 3/2006 | Yagi .................... | B41J 2/14233 |
| | | | | 347/71 |
| 2009/0048089 | A1 * | 2/2009 | Oobuchi et al. ............... | 501/135 |
| 2012/0184066 | A1 | 7/2012 | Yano et al. | |
| 2013/0056063 | A1 | 3/2013 | Kim et al. | |

FOREIGN PATENT DOCUMENTS

WO      WO-2012149414 A2      11/2012

OTHER PUBLICATIONS

Liu, P.C. et al.; "The Feasibility of Wafer Bonding by Indium Tin Oxide Intermediate Layer for Light Emitting Diodes"; < http://www.electrochem.org/dl/ma/203/pdfs/1029.pdf >.

* cited by examiner

*Primary Examiner* — Thomas Dougherty
(74) *Attorney, Agent, or Firm* — HP Inc. Patent Department

(57) ABSTRACT

An example provides an apparatus including a substrate, a metal layer, and an adhesive layer adhered between the substrate and the metal layer, the adhesive layer comprising zinc-gallium oxide, zinc-indium oxide, zinc-gallium-tin oxide, or zinc-indium-tin oxide.

20 Claims, 4 Drawing Sheets

300

```
Adhere a metal layer to a substrate using an adhesive     ─ 305
layer comprising zinc-gallium oxide, zinc-indium oxide,
  zinc-gallium-tin oxide, or zinc-indium-tin oxide
```

Figure 3

FILM STACK INCLUDING ADHESIVE LAYER

BACKGROUND

Devices are sometimes formed using a thin film stack of materials. For example, piezoelectric devices, ferroelectric devices, pyroelectric devices, electrocaloric devices, and various other types of devices may include such thin film stacks in a specific configuration. Often, the thin film stack may include or may be applied to an electrode, which in turn may be adhered to an underlying substrate layer.

BRIEF DESCRIPTION OF THE DRAWINGS

The detailed description section references the drawings, wherein:

FIG. 3 is a flow diagram of an example method for forming a film stack, in accordance with various implementations.

DETAILED DESCRIPTION OF EMBODIMENTS

Figure 1:
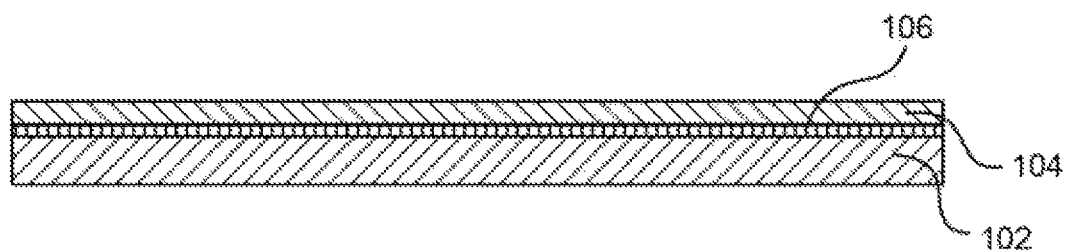
FIG. 1 illustrates an example film stack, in accordance with various implementations.

Various devices may be fabricated using thin film stacks of materials. Piezoelectric devices, such as piezoelectric inkjet printheads, actuators, or sensors, may be prepared by stacking various piezoelectric materials, other films, and metal, e.g., conductors and/or electrodes, in specific configurations for piezoelectric actuation or piezoelectric sensing. One such piezoelectric material is lead zirconate titanate (PZT), which can be grown or otherwise applied on the surface of an electrode. A number of other types of devices such as, for example, ferroelectric devices, pyroelectric devices, electrocaloric devices, to name a few, may likewise include thin film layers applied on a surface of an electrode.

The electrode may sometimes be adhered to another material, such as, for example, an underlying substrate layer. Adhesion between the electrode and the other material, however, may tend to be weak, especially between many noble metal electrodes to non-metallic surfaces, oxide surfaces, or polymer surfaces. Some transition metals, such as copper, may also not adhere well to non-metallic surfaces. The adhesion between the electrode and the other material may be further impacted by high temperatures and piezoelectric vibration.

Moreover, elements or compounds in the layers of the thin film stack may sometimes tend to migrate between the layers. PZT, for example, may provide a source for lead ion migration through metal electrodes into one or more other layers of the thin film stack, which can undermine the function of the device over time.

Described herein are various examples of thin film stacks including a substrate, a metal layer, and an adhesive layer adhered between the substrate and the metal layer. Apparatuses including such thin film stacks and methods for forming such thin film stacks are also described. In various implementations, the adhesive layer may comprise zinc-gallium oxide, zinc-indium oxide, zinc-gallium-tin oxide, or zinc-indium-tin oxide, and in various implementations, the adhesive layer may provide robust adhesion of the metal layer with the substrate, with thermal stability and bulk and surface uniformity. In various implementations, the thin film stack may include a piezoelectric layer. The metal layer may be a first electrode and the thin film stack may include a second electrode.

In each of the various embodiments described herein, whether discussing the thin film stack or related methods, there may be some common features of each of these embodiments that further characterize options in accordance with principles discussed herein. Thus, any discussion of the thin film stack or method, either alone or in combination, is also applicable to the other embodiments not specifically mentioned. For example, a discussion of the adhesive layer in the context of the thin film stack is also applicable to the related method, and vice versa.

It is noted that when referring to the various oxides, such as "indium oxide," "tin oxide," or "gallium oxide," these terms can include any of various blends of the oxidized metals. For example, indium oxide may be typically found in the form of indium sesquioxide ($In_2O_3$), and gallium oxide may be typically in the form of gallium sesquioxide ($Ga_2O_3$). Other forms, however, can be present. It is further noted that when referring to "titanium oxide" for comparison purposes, it is understood that there may be various forms of titanium oxides, including $TiO_2$, $Ti2O_3$, TiO, etc., and thus, the general term "titanium oxide" is used to include layers that generally include oxidized titanium.

Turning now to FIG. 1, illustrated is an example film stack 100 in accordance with various embodiments of the present disclosure. The film stack 100 may include a substrate 102, a metal layer 104, and an adhesive layer 106, which may comprise zinc-gallium oxide, zinc-indium oxide, zinc-gallium-tin oxide, or zinc-indium-tin oxide. The adhesive layer 106 may be adhered between the substrate 102 and the metal layer 104 to adhere the metal layer 104 to the substrate 102. In various implementations, the metal layer 104 may be an electrode. The adhesive layer 106 may provide robust adhesion of the metal layer 104 with the substrate 102, with thermal stability and bulk and surface uniformity.

The film stack 100 may be incorporated into various apparatuses and systems. In various implementations, the film stack 100 may be incorporated into printheads, actuators, sensors, etc. In a number of implementations, the film stack 100 may be incorporated into an apparatus or system including piezoelectric, ferroelectric, pyroelectric, or electrocaloric thin film layers, or other types of thin film layers. For example, the film stack 100 may be incorporated into a piezoelectric printhead, a piezoelectric actuator, a piezoelectric sensor, etc. A wide variety of other devices may include at least one of the various examples of the film stacks described herein without departing from the scope of this disclosure.

Figure 2:
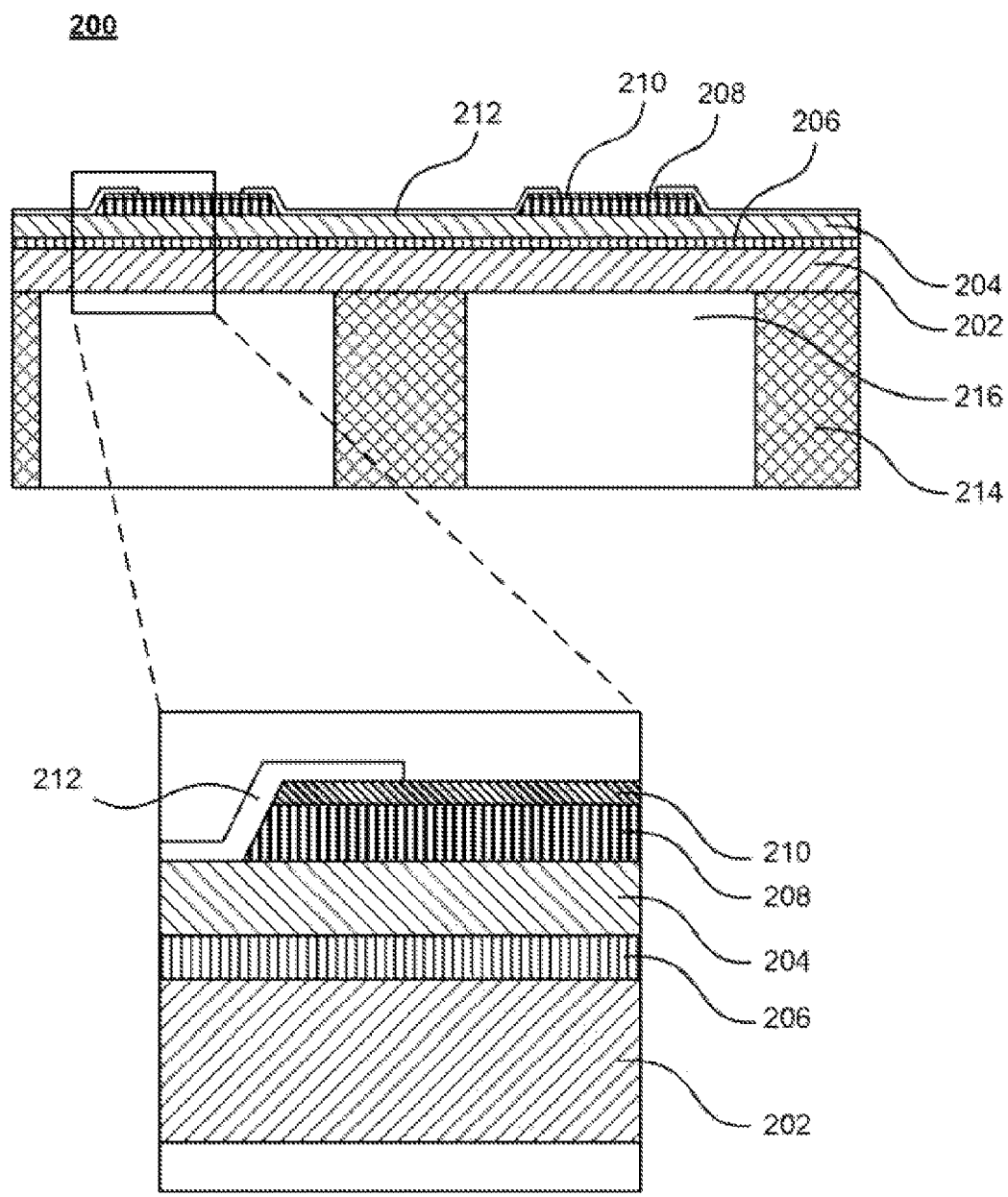
FIG. 2 illustrates another example film stack, in accordance with various implementations.

Turning now to FIG. 2, illustrated is an example film stack 200, which may include layers similar to those of the film stack 100 of FIG. 1. In various implementations, the film stack 200 may form part of an apparatus such as, for example, a piezoelectric printhead or a piezoelectric actuator for a printhead.

As illustrated, the film stack 200 includes a substrate 202, a first metal layer forming a first electrode 204, and an adhesive layer 206, which may comprise zinc-gallium oxide, zinc-indium oxide, zinc-gallium-tin oxide, or zinc-indium-tin oxide. In various implementations, the adhesive layer 206 may be directly on the substrate 202. In various implementations, the first electrode 204 may be directly on the adhesive layer 206.

The thin film stack 200 may further include a piezoelectric layer 208, a second metal layer forming a second electrode 210, and a passivation layer 212, as illustrated. The piezoelectric layer 208 may be disposed on the first electrode 204 such that the first electrode 204 is between the adhesive layer 206 and the piezoelectric layer 208, as illustrated. The second electrode 210 may be disposed on the piezoelectric layer 208 such that the piezoelectric layer 208 is between the first electrode 204 and the second electrode 210, as illustrated. Other layers may also be usable, including, for example, other insulating, semi-conducting, conducting, or protective layers, which are not illustrated.

The substrate 202 may comprise a material to support other layers of the film stack. In various implementations, the substrate 202 may comprise a material selected from silicon, nitrides, carbides, oxides, metals, or combinations thereof. In various implementations, the substrate 202 may comprise an oxide layer or multiple layers including at least one oxide layer. In one implementation, the substrate 202 may comprise a silicon wafer with a surface layer of silicon oxide. In some of these implementations, the substrate 202 may comprise at least one of $SiO_2$, $ZrO_2$, $HfO_2$, $Ta_2O_5$, $Al_2O_3$, $SrTiO_3$, etc. When the substrate 202 is in the form of a thin film or membrane, the substrate 202 may be formed at a thickness in a range of 1 nm to 10,000 nm. In yet another example, the substrate 202 may have a thickness of substantially 500 nm. In still further examples in which the substrate 202 comprises a silicon wafer, the thickness of the substrate 202 may be up to about 725 microns. In other examples, the substrate 202 may comprise a thin silicon wafer (sometimes referred to as an "ultrathin" silicon wafer), which may have a thickness in a range of 3 microns to 200 microns. Various other examples may have a thickness outside of the foregoing ranges.

In various implementations, the film stack 200 may include a support 214. The support 214 may include multiple chambers 216, which may receive and jet ink therefrom. It is noted that often, ink chambers, or other areas where ink may contact the printhead, may include a protective coating (not illustrated). For example, various implementations may include a protective coating of tantalum or a tantalum oxide (such as, e.g., $Ta_2O_5$), or a combination thereof.

The support 214 may comprise a semi-conductive material such as, for example, silicon, either alone or in an assembly comprising other materials applied thereto. In some implementations, the support 214 may be a metallic support comprising a metallic material with an insulating material applied thereto. Examples of specific materials that may be used for the support 214 may include, but are not limited to, silicon, glass, gallium arsenide, silicon on sapphire (SOS) structures, epitaxial structures, germanium, germanium silicon, diamond, silicon on insulator (SOI) structures, selective implantation of oxygen (SiMOX) substrates, or other structures. In some implementations, the substrate 202 may be integral to the support 214, particularly when the support 214 inherently includes an oxidized surface. In a number of examples, however, the substrate 202 may comprise a separate membrane of oxidized material coupled to the support 214. In some cases, providing the substrate 202 as a separate membrane may help prevent diffusion of the metal of the first electrode 204 into the support 214.

The piezoelectric layer 208 may comprise any suitable piezoelectric material. In various implementations, the piezoelectric layer 208 may comprise lead zirconium titanate (PZT). In various ones of these implementations, the PZT of the piezoelectric layer 208 may have a general formula $Pb(Zr_{1-x}Ti_x)O_3$, where x is from 0.1 to 0.9. The piezoelectric layer 210 may comprise any of a number of lead-based piezoelectric materials, with various dopants. Examples of suitable lead-based piezoelectric materials for the piezoelectric layer 208 may include, but are not limited to, lead lanthanum zirconium titanate (PLZT, or La doped PZT), lead niobium zirconium titanate (PNZT, or Nb doped PZT), or PMN—PT $(Pb(Mg_{1/3}Nb_{2/3})O_3$—$PbTiO_3)$. In various implementations, the piezoelectric layer 208 may comprise any of a number of lead-free piezoelectric materials, with various dopants. Examples of suitable lead-free piezoelectric materials for the piezoelectric layer 208 may include, but are not limited to, $LiNbO_3$, BCTZ [$Ba(Ti_{0.8}Zr_{0.2})O_3$—$(Ba_{0.7}Ca_{0.3})TiO_3$], tungsten bronze structured ferroelectrics (TBSF), BNT-BT [$(Bi_{0.5}Na_{0.5})TiO_3$—$BaTiO_3$], BT [$BaTiO_3$], AlN, AlN doped with Sc, and ternary compositions in the BKT-BNT-BZT [$(Bi_{0.5}K_{0.5})TiO_3$—$(Bi_{0.5}Na_{0.5})TiO_3$—$Bi(Zn_{0.5}Ti_{0.5})O_3$] system, a specific example of which includes $0.4(Bi_{0.5}K_{0.5})TiO_3$-$0.5(Bi_{0.5}Na_{0.5})TiO_3$-$0.1Bi(Zn_{0.5}Ti_{0.5}O_3)$. Other suitable piezoelectric materials may be used for the piezoelectric layer piezoelectric layer 208, or combinations of materials or multiple layers may likewise be used in accordance with examples of the present disclosure.

In various implementations, the thickness of the substrate 202 may be substantially the same thickness as the piezoelectric layer 208. In some examples, a thickness ratio of the substrate 202 to the piezoelectric layer 208 may be in a range of 1:2 to 2:1. For various ones of these examples, the substrate 202 and the piezoelectric layer 208 may each have a thickness of at least 50 nm.

The first electrode 204 and the second electrode 210 may, during operation, generate an electric field with respect to the piezoelectric layer 208, which may cause the piezoelectric layer 208 to actuate. For at least some implementations in which the film stack 200 forms part of a piezoelectric printhead, the film stack 100 may generate vibrations into an appropriate ink chamber 216 as the piezoelectric layer 208 is actuated, causing inkjetting to occur.

In various implementations, the first electrode 204 and the second electrode 210 may comprise any material suitable for the application. Examples of materials that may be suitable for forming the first electrode 204 may include, but are not limited to, noble metals or other metals or alloys, including but not limited to, platinum, silver, copper, gold, ruthenium, iridium, nickel, molybdenum, rhodium, palladium, and alloys thereof. In other examples, oxides of the foregoing materials or other metals may be suitable for forming the electrodes 204, 210. Examples of such oxides may include but are not limited to $IrO_2$, $RuO_2$, or $SrRuO_3$. In still further examples, the first electrode 204 may comprise a metal with a layer of conductive oxide such as, for example, iridium and $IrO_2$, or ruthenium and $RuO_2$, etc. In a number of implementations, platinum may be of particular interest as a metal for at least the first electrode 204. In at least some of these latter implementations, platinum may benefit from the example adhesive layers of the present disclosure because the surface of platinum may not readily become oxidized. In various implementations, the second electrode 210 may comprise any of the foregoing materials or a different material than that used for forming the first electrode 210.

In various implementations, the first electrode 204 and the second electrode 210 may be formed with a thickness suitable for the application. In an example, the first electrode 204 and/or the second electrode 210 may be formed with a thickness in a range of 5 nm to 5,000 nm. In another example, the first electrode 204 and/the second electrode 210 may have a thickness outside this range. In yet another example, the first electrode 204 may have a thickness of substantially 100 nm. In still another example, the first electrode 204 and the second electrode 210 may each have a thickness of substantially 100 nm.

In various implementations, the passivation layer 212 may comprise any material suitable for the application. Examples of suitable materials for the passivation layer 212 may include, but are not limited to, wet or dry process silicon dioxide, aluminum oxide (e.g., $Al_2O_3$), silicon carbide, silicon nitride, tetraethylorthosilicate-based oxides, borophosphosilicate glass, phosphosilicate glass, borosilicate glass, $HfO_2$, $ZrO_2$, or the like. In various examples, the passivation layer 212 may have a thickness in a range of 10 nm to 1 µm. In other examples, the passivation layer 212 may have a thickness outside this range.

As described herein, the adhesive layer 208 may comprise zinc-gallium oxide, zinc-indium oxide, zinc-gallium-tin oxide, or zinc-indium-tin oxide. In an example, the adhesive layer 208 may comprise zinc-gallium oxide having an Zn:Ga atomic ratio of x:y or zinc-indium oxide having an Zn:In atomic ratio of x:y, where x and y are independently in a range of about 0.05 to about 0.95. In another example, the adhesive layer 208 may comprise zinc-gallium-tin oxide having an Zn:Ga:Sn atomic ratio of x:y:z or zinc-indium-tin oxide having an Zn:In:Sn atomic ratio of x:y:z, where x, y, and z are independently in a range of about 0.05 to about 0.90. In still another example, the adhesive layer 208 may comprise zinc-gallium-tin oxide having an Zn:Ga:Sn atomic ratio of x:y:z or zinc-indium-tin oxide having an Zn:In:Sn atomic ratio of x:y:z, where x, y, and z are independently in a range of about 0.1 to about 0.8. In yet another example, the adhesive layer 208 may comprise zinc-gallium-tin oxide having an Zn:Ga:Sn atomic ration of about 1:1:1.

Although in many implementations the adhesive layer 208 may consist essentially of zinc-gallium oxide, zinc-indium oxide, zinc-gallium-tin oxide, or zinc-indium-tin oxide (essentially 100 atomic percent of the adhesive layer 208), in other implementations the adhesive layer 208 may include a dopant or multiple dopants. In some implementations, the zinc-gallium oxide, zinc-indium oxide, zinc-gallium-tin oxide, or zinc-indium-tin oxide may be present in a range of 90 atomic percent to 100 atomic percent with up to 10 atomic percent of dopant (based on a calculation of any element other than indium, tin, gallium, and oxygen). Dopant(s) may comprise elements of compounds containing elements, such as lead, antimony, iron, copper, calcium, cadmium, germanium, titanium, etc.

Ranges of dopant may be from 0.05 atomic percent to less than 3 atomic percent for individual elements, or from 0.05 atomic percent to less than 3 atomic percent for dopant compounds. In various examples, multiple dopants may be present, and thus, may exceed 3 atomic percent cumulatively in some cases, but any single dopant, if present, may be included at less than 3 atomic percent, with any element or compound (other than indium oxide, tin oxide, gallium oxide, indium-tin oxide, indium-gallium oxide, tin-gallium oxide, or indium-tin-gallium oxide) that is present at 3 atomic percent or greater not considered a dopant. For purposes of this disclosure, the zinc-gallium oxide, zinc-indium oxide, zinc-gallium-tin oxide, or zinc-indium-tin oxide of the adhesive layer 208 are not considered to be dopants. Thus, in the adhesive layer 208, any cation or other atom included that is other than zinc, indium, tin, gallium, or oxygen may be considered as a dopant.

The adhesive layer 208 may have a thickness suitable for the particular application. In an example, the adhesive layer 208 may have a thickness in a range of less than 1,000 nm. In another example, the adhesive layer 208 may have a thickness outside this range. In yet another example, the adhesive layer 208 may have a thickness in a range of 20 nm to 500 nm. In still another example, the adhesive layer 208 may have a thickness in a range of 1 nm to 500 nm.

The adhesive layer 208 may offer at least one of a number of advantages to the film stack 202 over conventional thin film stacks. In various implementations, the adhesive layer 208 may provide reliable adhesion to many noble and other metallic materials, including platinum, silver, copper, gold, ruthenium, iridium, nickel, molybdenum, rhodium, palladium, etc. Acceptable adhesion to non-metallic materials may also be achieved, making it a good adhesive to use between metallic (such as, e.g., the first electrode 206) and non-metallic layers or surfaces (such as, e.g., the substrate 204). In various implementations, the adhesive layer 208 may promote uniform mechanical performance, an atomically smooth interface, and acceptable barrier properties to lead and other impurities that could potentially migrate into the first electrode 206. In various examples, the adhesive layer 208 may be amorphous, and as an amorphous compound, the adhesion layer 208 may result in any of the foregoing advantages.

For example, with regard to barrier properties, titanium oxide has been known to be used as a barrier layer for thin film stacks, but although titanium oxide works as an acceptable barrier in preventing lead from passing through the titanium oxide itself, titanium oxide may not perform sufficiently well to prevent migration of the lead of a piezoelectric layer into and through some metal electrodes, such as, for example, platinum. As lead may react with titanium oxide to some degree to form lead titanate, even though the lead is stopped in the titanium oxide layer, it is still drawn through the metal electrode in order to contact the titanium oxide layer and react therewith. Specifically, with titanium oxide adhesive layers, a common lead content can be around 3 atomic percent (or 1:10 ratio of Pb to Ti). Lead titanate (PbTiO3) may have a 1:1 atomic ratio, and thus, there may be room for the attraction of lead by titanium oxide it some conditions (e.g., depending on the thickness, grain size/grain density of metal electrode layer, choice of metal, temperature and duration of anneal, etc.).

On the other hand, implementations of the adhesive layer 206 described herein may not have this same reactivity with lead (such as, e.g., that experienced by titanium oxide, etc.), and thus, there may be little to no migration into the first electrode 204 in the first place, as there may be no reactive conditions awaiting the lead on the other side of the electrode 204. In various implementations, therefore, the lead of the piezoelectric layer 208 may tend to stay out of the bulk of the metal electrode 204 altogether.

Various implementations of the adhesive layer 206 described herein may provide a reliable adhesion of noble metals to non-metallic substrates while remaining thermally stable at higher temperatures as compared to other adhesive layers. For example, with respect to platinum and other similar electrodes, there may be thermophysical instabilities at temperatures exceeding 700° C. as a result of low wettability, which may in turn lead to delamination. These defects sometimes cause degraded performance and may result in an inoperable device.

Various implementations of the adhesive layer 206 of the present disclosure may provide improved surface roughness (e.g., maintenance of smoothness, even at very high manufacturing temperatures). Generally, as processing temperatures are increased, the surface roughness of a number of materials may increase. Various implementations of the adhesive layer 206, however, avoid increased surface roughness, even with very high annealing temperatures (such as, e.g., 1000° C. or more), at least to the level experienced by conventional adhesive layers.

Figure 4:
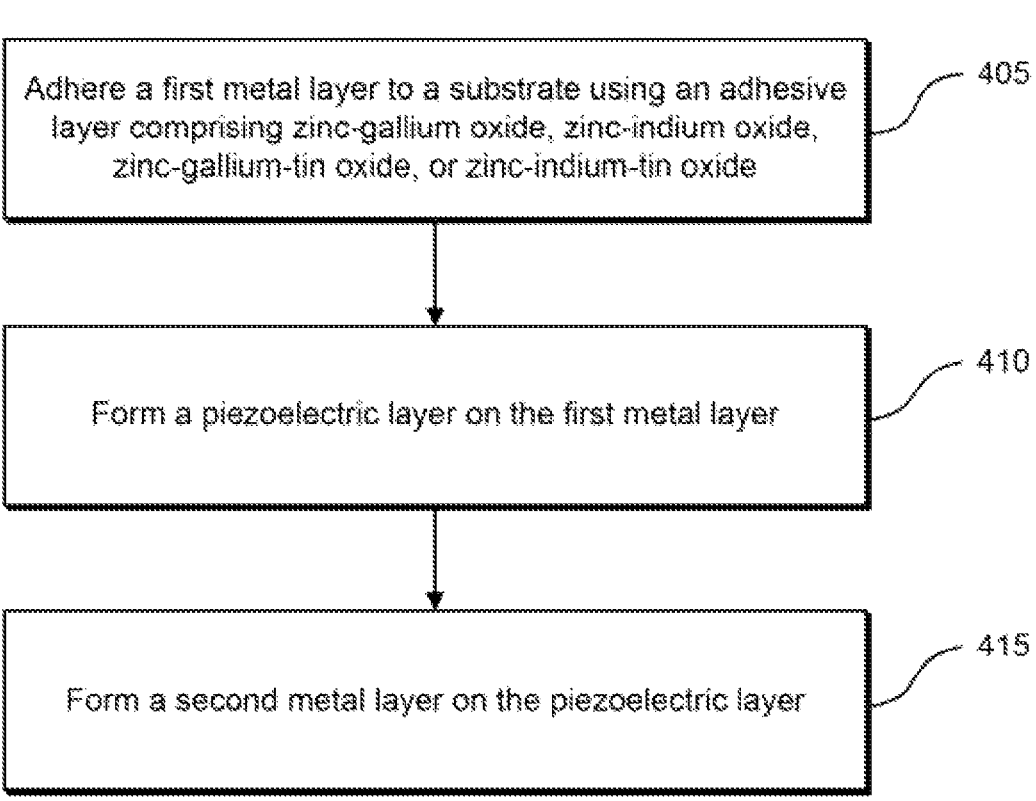
FIG. 4 is a flow diagram of another example method for forming a film stack, in accordance with various implementations.

Flow diagrams describing various methods for forming film stacks, in accordance with various implementations, are illustrated in FIGS. 3 and 4. While the flow diagrams may illustrate various operations in a particular order, the drawings are not intended to limit the present disclosure to any particular order. Additionally, the drawings are not intended to imply that all operations are required for all implementations.

Turning now to FIG. 3, processing for the method 300 may begin or continue with adhering a metal layer to a substrate using an adhesive layer comprising zinc-gallium oxide, zinc-indium oxide, zinc-gallium-tin oxide, or zinc-indium-tin oxide, at block 305. In various implementations, adhering the metal layer to the substrate may comprise forming the adhesive layer on the substrate and forming the metal layer on the adhesive layer. In some of these implementations, the metal layer may be formed on the adhesive layer after the adhesive layer is formed on the substrate. In various implementations, the method 300 may comprise annealing the adhesive layer prior to forming the metal layer on the adhesive layer. In various implementations, the metal layer may be a first electrode.

The adhesive layer may be formed on the substrate using any of a number of suitable operations including, but not limited to, sol-gel deposition, physical vapor deposition (PVD), pulsed laser deposition (PLD), atomic layer deposition (ALD), plasma enhanced chemical vapor deposition (PECVD), a low pressure chemical vapor deposition (LPCVD), an atmosphere pressure chemical vapor deposition (APCVD), sputter deposition, evaporation, thermal oxide deposition or growth, or another operation. In various examples, the metal layer may be formed by sputtering, evaporation, plasma deposition, electroplating, or another operation.

Turning now to FIG. 4, processing for the method 400 may begin or continue with adhering a metal layer, which may be a first metal layer, to a substrate using an adhesive layer comprising zinc-gallium oxide, zinc-indium oxide, zinc-gallium-tin oxide, or zinc-indium-tin oxide, at block 405. In various implementations, the first metal layer may be a first electrode.

The method may proceed to block 410 by forming a piezoelectric layer on the first metal layer. In various implementations, the piezoelectric layer may be formed using any suitable operation. Examples of suitable operations for forming the piezoelectric layer may include, but are not limited to, sol-gel deposition, physical vapor deposition (PVD), pulsed laser deposition (PLD), atomic layer deposition (ALD), or another operation.

The method may proceed with forming a second metal layer on the piezoelectric layer, at block 415. In various implementations, the second metal layer may be a second electrode. The second metal layer may be formed by sputtering, evaporation, plasma deposition, electroplating, or another operation.

Various aspects of the illustrative embodiments are described herein using terms commonly employed by those skilled in the art to convey the substance of their work to others skilled in the art. It will be apparent to those skilled in the art that alternate embodiments may be practiced with only some of the described aspects. For purposes of explanation, specific numbers, materials, and configurations are set forth in order to provide a thorough understanding of the illustrative embodiments. It will be apparent to one skilled in the art that alternate embodiments may be practiced without the specific details. In other instances, well-known features are omitted or simplified in order not to obscure the illustrative embodiments. It is also to be understood that features of the various examples described herein may be combined with each other, unless specifically noted otherwise.

The phrases "in an example," "in various examples," "in some examples," "in various embodiments," and "in some embodiments" are used repeatedly. The phrases generally do not refer to the same embodiments; however, they may. The terms "comprising," "having," and "including" are synonymous, unless the context dictates otherwise. The phrase "A and/or B" means (A), (B), or (A and B). The phrase "A/B" means (A), (B), or (A and B), similar to the phrase "A and/or B". The phrase "at least one of A, B, and C" means (A), (B), (C), (A and B), (A and C), (B and C), or (A, B and C). The phrase "(A) B" means (B) or (A and B), that is, A is optional.

It is noted that the drawings herein are made to the accompanying drawings which form a part hereof, and in which is shown by way of illustration specific examples are not to be considered as being to scale, and are thus, merely schematic to assist in showing and describing an embodiment of the present disclosure. Directional terminology, such as "top," "bottom," "front," "back," etc., are used with reference to the orientation of the drawing(s) described. Because the various components can be positioned in a number of different orientations, the directional terminology may be used for purposes of illustration and is in no way limiting. It is to be understood that other versions may be utilized and structural or logical changes may be made without departing from the scope of the present invention. Furthermore, though an inkjet printhead is shown in the drawings, with various specific layers, it is understood that this is not intended to limit the scope of the present disclosure. This example is merely provided to show an example of the various thin film stacks that can be used in various devices, such as piezoelectric actuators or sensors.

Although certain embodiments have been illustrated and described herein, it will be appreciated by those of ordinary skill in the art that a wide variety of alternate and/or equivalent embodiments or implementations calculated to achieve the same purposes may be substituted for the embodiments shown and described without departing from the scope of this disclosure. Those with skill in the art will readily appreciate that embodiments may be implemented in a wide variety of ways. This application is intended to cover any adaptations or variations of the embodiments discussed herein. It is manifestly intended, therefore, that embodiments be limited only by the claims and the equivalents thereof.

What is claimed is:

1. A piezoelectric printhead, comprising:
 a substrate;
 a metal layer;
 a piezoelectric layer to generate mechanical vibrations in the device, comprising a material disposed on a first side of the metal layer, the material tending to migrate through the metal layer; and
 an adhesive layer adhered between the substrate and an opposing second side of the metal layer, the adhesive layer to inhibit migration of the material from the piezoelectric layer into the metal layer, the adhesive layer comprising zinc-gallium oxide, zinc-indium oxide, zinc-gallium-tin oxide, or zinc-indium-tin oxide.

2. The piezoelectric printhead of claim 1, wherein the adhesive layer comprises zinc-gallium oxide having an Zn:Ga atomic ratio of x:y, where x and y are independently in a range of about 0.05 to about 0.95.

3. The piezoelectric printhead of claim 1, wherein the adhesive layer comprises zinc-indium oxide having an Zn:In atomic ratio of x:y, where x and y are independently in a range of about 0.05 to about 0.95.

4. The piezoelectric printhead of claim 1, wherein the adhesive layer comprises zinc-gallium-tin oxide having an Zn:Ga:Sn atomic ratio of x:y:z, where x, y, and z are independently in a range of about 0.05 to about 0.90.

5. The piezoelectric printhead of claim 1, wherein the adhesive layer comprises zinc-indium-tin oxide having an Zn:In:Sn atomic ratio of x:y:z, where x, y, and z are independently in a range of about 0.05 to about 0.90.

6. The piezoelectric printhead of claim 1, wherein the adhesive layer comprises zinc-gallium-tin oxide having an Zn:Ga:Sn atomic ration of about 1:1:1.

7. The piezoelectric printhead of claim 1, wherein the adhesive layer comprises zinc-gallium-tin oxide having an Zn:Ga:Sn atomic ratio of x:y:z, where x, y, and z are independently in a range of about 0.1 to about 0.8.

8. The piezoelectric printhead of claim 1, wherein the adhesive layer comprises zinc-indium-tin oxide having an Zn:In:Sn atomic ratio of x:y:z, where x, y, and z are independently in a range of about 0.1 to about 0.8.

9. The piezoelectric printhead of claim 1, wherein the adhesive layer has a thickness of less than 1,000 nm.

10. The piezoelectric printhead of claim 1, wherein the metal layer is a first electrode, and wherein the apparatus further comprises a piezoelectric layer on the first electrode and a second electrode on the piezoelectric layer such that the first electrode is between the adhesive layer and the piezoelectric layer and the piezoelectric layer is between the first electrode and the second electrode.

11. The piezoelectric printhead of claim 1, wherein the substrate, the metal layer, and the adhesive layer form, at least in part, a printhead, an actuator, or a sensor.

12. The piezoelectric printhead of claim 1, wherein the substrate comprises a membrane having a thickness in a range of about 1 nm to about 10,000 nm, and wherein the membrane comprises a material selected from a group consisting of silicon, nitrides, carbides, oxides, and metals.

13. The piezoelectric printhead of claim 1, wherein the metal layer is an electrode having a thickness in a range of about 5 nm to about 5,000 nm, and wherein the electrode comprises a metal oxide or a metal selected from a group consisting of platinum, silver, copper, gold, ruthenium, iridium, nickel, molybdenum, rhodium, palladium, and alloys thereof, or a combination thereof.

14. A method for forming a piezoelectric printhead, comprising:
    adhering a first side of a metal layer to a substrate layer using an adhesive layer comprising indium oxide, tin oxide, gallium oxide, indium-tin oxide, indium-gallium oxide, tin-gallium oxide, or indium-tin-gallium oxide; and
    forming a piezoelectric layer on a second side of the metal layer; and
    annealing the printhead at a temperature of at least 1000 degrees centigrade without substantially degrading surface smoothness of the layers.

15. The method of claim 14, comprising:
    forming another metal layer on the piezoelectric layer.

16. The piezoelectric printhead of claim 1, wherein the piezoelectric layer material includes metallic ions, and wherein the adhesive layer inhibits migration of the metallic ions from the piezoelectric layer into the metal layer.

17. The piezoelectric printhead of claim 1, wherein the piezoelectric layer comprises lead zirconate titantate, and wherein the adhesive layer inhibits migration of lead ions from the piezoelectric layer into the metal layer.

18. The piezoelectric printhead of claim 1, wherein the adhesion of the adhesive layer to the substrate and the second side of the metal layer is substantially unaffected by the mechanical vibrations.

19. The piezoelectric printhead of claim 1, wherein the adhesion of the adhesive layer to the substrate and the second side of the metal layer is substantially unaffected by a device temperature up to 1000 degrees centigrade.

20. The piezoelectric printhead of claim 1, comprising:
    a chamber to eject a liquid from the chamber responsive to the mechanical vibrations.

\* \* \* \* \*